United States Patent [19]
Hoshi et al.

[11] Patent Number: 5,089,425
[45] Date of Patent: Feb. 18, 1992

[54] PHOTOELECTRIC CONVERTING DEVICE HAVING AN ELECTRODE FORMED ACROSS AN INSULATING LAYER ON A CONTROL ELECTRODE AND METHOD FOR PRODUCING THE SAME

[75] Inventors: Junichi Hoshi, Atsugi; Tamotsu Satoh, Yokohama; Shiro Arikawa, Atsugi, all of Japan

[73] Assignee: Canon Kabushiki Kaisha, Tokyo, Japan

[21] Appl. No.: 411,219

[22] Filed: Sep. 22, 1989

Related U.S. Application Data

[60] Division of Ser. No. 241,836, Sep. 6, 1988, abandoned, which is a continuation of Ser. No. 9,923, Feb. 2, 1987, abandoned.

[30] Foreign Application Priority Data

| Feb. 4, 1986 | [JP] | Japan | 61-023282 |
| Jun. 2, 1986 | [JP] | Japan | 61-125937 |
| Jul. 4, 1986 | [JP] | Japan | 61-156266 |

[51] Int. Cl.$^5$ .............................. H01L 31/18
[52] U.S. Cl. ................................ 437/3; 437/31; 437/978; 437/984
[58] Field of Search ............... 437/3, 43, 31, 984, 437/978; 357/30; 148/DIG. 43

[56] References Cited

U.S. PATENT DOCUMENTS

| 3,533,158 | 10/1970 | Bower | 437/41 |
| 3,624,428 | 11/1971 | Weimer | 357/32 |
| 3,816,769 | 6/1974 | Crowle | 357/23.6 |
| 3,909,306 | 9/1975 | Sakamoto et al. | 437/41 |
| 3,964,083 | 6/1976 | Lohstroh | 357/30 |
| 4,242,695 | 12/1980 | Ouchi | 357/30 |
| 4,375,717 | 3/1983 | Tonnel | 357/23.14 |
| 4,450,466 | 5/1984 | Nishizawa et al. | 357/30 |
| 4,686,554 | 8/1987 | Ohmi et al. | 357/34 |

FOREIGN PATENT DOCUMENTS

| 022388 | 1/1981 | European Pat. Off. | 357/23.14 |
| 60-251657 | 12/1985 | Japan | 357/30 |
| 60-142561 | 7/1988 | Japan | 357/51 |

OTHER PUBLICATIONS

Glaser et al., *Integrated Circuit Engineering* Addison-Wesley Reading, Mass., 1977 pp. 277–280.

*Primary Examiner*—Brian E. Hearn
*Assistant Examiner*—C. Chaudhari
*Attorney, Agent, or Firm*—Fitzpatrick, Cella, Harper & Scinto

[57] ABSTRACT

A method for producing a photoelectric converting device having an electrode formed across an insulating layer on a control electrode region. The control electrode region and main electrode region are formed by a self-alignment process utilizing a field insulating layer as a mask. The insulating layer is formed on the control electrode region with the electrode formed thereon.

3 Claims, 10 Drawing Sheets

PHOTOELECTRIC CONVERTING DEVICE HAVING AN ELECTRODE FORMED ACROSS AN INSULATING LAYER ON A CONTROL ELECTRODE AND METHOD FOR PRODUCING THE SAME

This application is a division of application Ser. No. 241,836 abandoned filed Sept. 6, 1988, which is a continuation of application Ser. No. 009,923 filed Feb. 2, 1987.

BACKGROUND OF THE INVENTION

1. Field of the Invention

The present invention relates to a photoelectric converting device, more particularly a photoelectric converting device obtained by forming an electrode across an insulating layer on a control electrode area of a semiconductor transistor, and a method for producing the same.

2. Related Background Art

In conventional semiconductor image pickup devices, the cell size of the sensor portion, constituting a separate device, cannot be considered sufficiently small in comparison with the advanced degree of integration of a driving circuit portion. For example, in contrast to the usual cell size of about 70 $\mu m^2$ in a 256K DRAM, that of a semiconductor image pickup device for example of 500×500 pixels is as several times as large as 200 to 300 $\mu m^2$. An increase in the cell size increases the chip area and therefore reduces the number of chips per wafer. Also in comparison with usual digital logic circuit devices, semiconductor image pickup devices are associated with much lower production yields because they have to satisfy optical and analog requirements. For these reasons the cost per chip of the sensor portion is inevitably higher than that of DRAMS or similar devices.

The reduction of cell size can be achieved either by a scale-down method, in which dimensions are proportionally reduced, or by a cell improvement method, in which the number of cells constituting components is reduced.

The cell size has been reduced year after year with the progress of microintegration technology, but the rate of size reduction is averaging in the range 0.88 times per year. Thus a drastic size reduction cannot be expected in the former method. More detailedly, though a size reduction results in a reduction in the chip area and thus an increase in the number of chips per wafer, the production yield is lowered due to increased difficulty of process control. Consequently, the number of defectless chips per wafer will show a peak at a certain cell dimension.

On the other hand, the latter method can achieve a drastic reduction in size. For example, in case of a random access memory, a memory unit originally composed of 6 to 8 transistors is now simplified as a transistor and a capacitor.

The latter cell improvement method is also effective in the field of semiconductor image pickup devices. For example charge-coupled image pickup devices (CCD) are now superior to MOS image pickup devices in simplicity and integration, by isolating each carrier accumulating portion not by a mechanical structure but by an electrically formed potential well. Also the charge transfer portion does not require sources and drains in the MOS structure and can therefore achieve a higher degree of integration. Though CCD's can achieve a higher level of integration in comparison with MOS devices, they are disadvantageous in production yield, because, in CCD's, a defect in the charge transfer portion affects the image information of an entire corresponding line. Also defects in the substrate cannot be tolerated because the information transfer is conducted not by metal wirings but by the interior of the substrate itself, and these facts deteriorate the production yield and raise the production cost. Under such a situation, CCD's and MOS devices are now competing with each other in the field of semiconductor image pickup devices.

SUMMARY OF THE INVENTION

An object of the present invention is to reduce the cell size of a photoelectric converting device through an improvement in the cell structure thereof.

Another object of the present invention is to provide a method for producing a photoelectric converting device with an improvement in precision of the control electrode region and the main electrode domain in the cells thereof.

Still another object of the present invention is to provide a photoelectric converting device with a reduced cell size achieved by economizing the area of a transistor refreshing the stored charge in each photoelectric converting cell.

Still another object of the present invention is to provide a photoelectric converting device with a reduced cell size achieved by reducing the area of a control electrode area in each photoelectric converting cell.

DETAILED DESCRIPTION OF THE PREFERRED EMBODIMENTS

Now, the present invention will be clarified by a detailed description of the preferred embodiments thereof shown in the attached drawings.

A semiconductor image pickup device of a high level of integration can be formed with the photoelectric converting device disclosed in the Japanese Patent Laid-open No. 12759/1985.

Figure 1A:
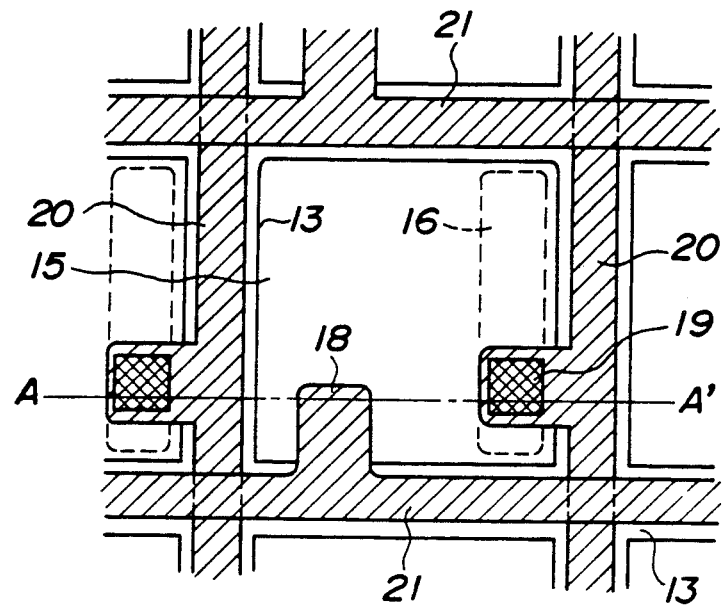
FIG. 1(a) is a plan view of a photoelectric converting device.
Figure 1B:
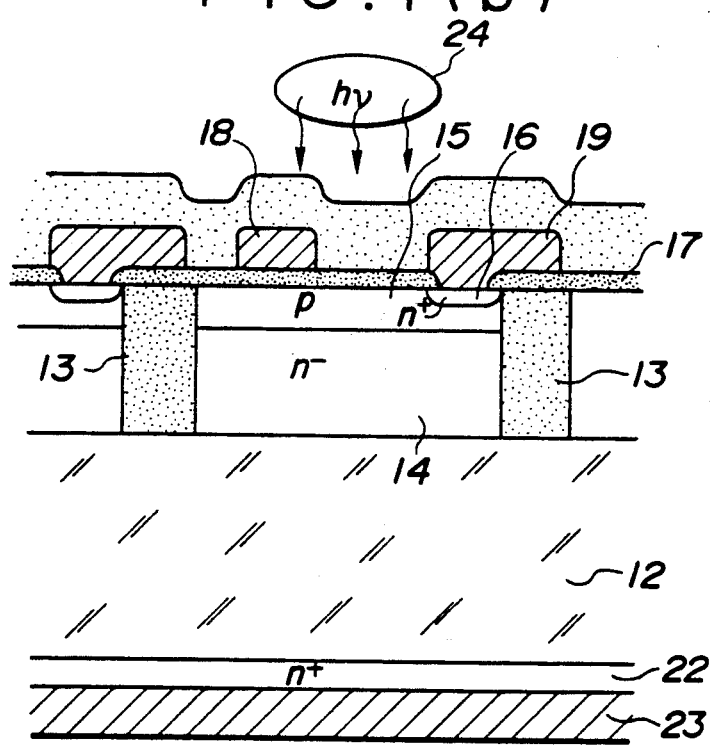
FIG. 1(b) is a cross-sectional view along a line A-A' in FIG. 1(a)

FIG. 1(a) is a plan view of said photoelectric converting device, and FIG. 1(b) is a cross-sectional view along a line A–A' thereof.

In FIGS. 1(a) and 1(b), photosensor cells are arranged on an n+-silicon substrate 12, and each photosensor cell is electrically insulated from neighboring photosensor cells by a separating area 13 composed of $SiO_2$, $Si_3N_4$ or polysilicon.

Each photosensor cell is composed in the following manner.

On an n⁻-region 14 of a low impurity concentration formed for example by epitaxial growth, a p-region 15 is formed by doping with a p-type impurity such as boron, and an n+-region 16 is formed thereon by impurity diffusion or ion implantation. The p-domain 15 and n+-region 16 respectively constitute base and emitter of a bipolar transistor.

On the p-region 15 of the above-explained structure and on a separating area 13, there is formed an oxide layer 17 on which is formed an electrode 18 of a predetermined area. Said electrode 18 faces the p-domain 15 across the oxide layer 17 and receives a pulse voltage to control the potential of the p-region 15 in floating state. An emitter electrode 19 is connected to the n+-region 16, a conductor 20 conducts a signal from the emitter electrode 19 to the outside, a conductor 21 is connected to the electrode 18, an n+-region 22 of a high impurity concentration is formed on the rear face of the n+-silicon substrate 12. An electrode 23 biases the collector of the bipolar transistor.

The above-explained photoelectric converting device functions in the following manner.

In response to incident light 24, electron-hole pairs are generated in the semiconductor in proportion to the intensity of incident light. The electrons escape to the positively biased n+-silicon substrate 12, but the positive holes are stored in the p-region 15 (storing operation). The base potential is elevated by the stored positive holes. The base potential is further elevated by a voltage applied across the n+-region 16 constituting the emitter and the n+-silicon substrate 12 constituting the collector, and by a positive voltage applied to the electrode 18. This potential change is read as the collector current, constituting an electric signal corresponding to the intensity of incident light (read-out operation). The charge stored in the p-region 15 can be eliminated by grounding the emitter electrode 19 and applying a positive pulse to the electrode 18. The positive voltage biases the p-region 15 in a forward direction with respect to the n+-domain 16, thereby discharging the stored charge (refreshing operation). The above-mentioned steps of storage, read-out and refreshing are repeated thereafter.

However the above-explained photoelectric converting device, when applied to a semiconductor image pickup device of 500×500 pixels, requires a cell size of about 200 $\mu m^2$ and is not adequate for achieving a high level of integration.

Figure 2A:
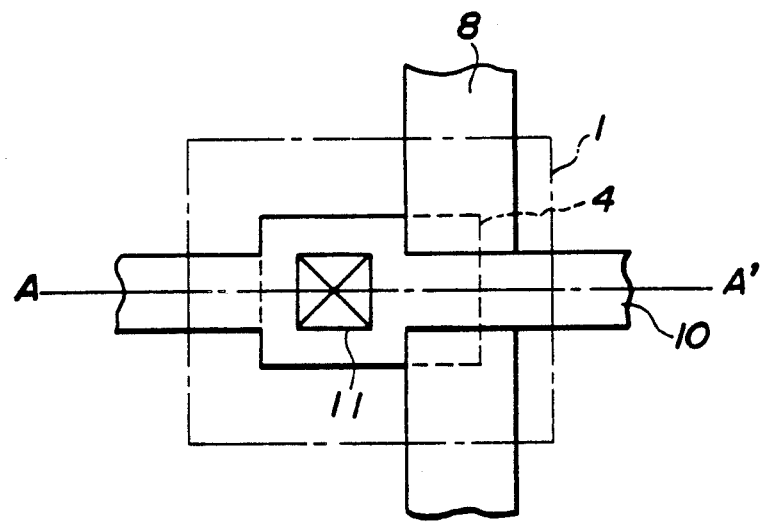
FIG. 2(a) is a schematic view of a sensor cell of a semiconductor image pickup device obtained according to the process for producing a photoelectric converting device of the present invention.
Figure 2B:
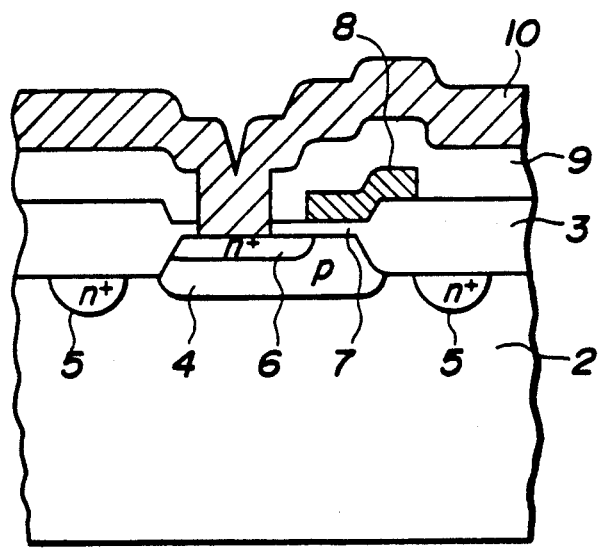
FIG. 2(b) is a cross-sectional view along a line A-A' in FIG. 2(a)

FIG. 2(a) is a plan view of a sensor cell of a semiconductor image pickup device, obtained by the method of the present invention for producing a photoelectric converting device not associated with the above-explained drawbacks. FIG. 2(b) is a cross-sectional view along a line A–A'. In the present embodiment the semiconductor transistor is composed of a bipolar transistor, the control electrode being composed of the base and the main electrode is composed of the emitter thereof.

In FIG. 2(a), 1 indicates a sensor cell. On a CZN(100) 10 Ω-cm silicon substrate 2, there is formed a field oxide layer 3 of a thickness of 1 μm by a LOCOS process. Under the field oxide layer 3 there may be formed an n+-channel stopper 5 if necessary, for preventing the transfer of positive holes from the neighboring channel. Then a p-region 4, constituting a base, of an impurity concentration of $10^{14}/cm^3$ and a diffusion depth of 0.8 μm is formed by a self-aligning process utilizing the field oxide layer 3 as a mask. The basic dimension (minimum rule) is equal to the length of a side of a contact hole to be explained later, and said p-region 4 constituting an active area is 3×2 times as large as the basic dimension. Then an insulating layer 7 of a thickness of 500 Å is formed, and a polysilicon electrode 8 of a thickness of 4,000 Å is formed thereon, constituting a gate electrode for the p-region 4. The electrode 8 is partially placed on the field oxide layer 3 and has a margin for misalignment. An n+-region 6 then is formed, constituting an emitter, of an impurity concentration of $10^{19}/cm^3$ and a diffusion depth of 0.3 μm being formed by self-aligned ion implantation utilizing the field oxide layer 3 and the electrode 8. The silicon substrate 2, p-region 4 and n+-region 6 constitute a vertical bipolar transistor with the magnitude of $h_{ff}$ in the order of 1,000. Then a PSG interlayer insulator 9 of a thickness of 7,000 Å is formed, a contact hole 11 is opened, and a metal wiring 10 of a thickness of 8,000 Å is electrically connected to the n+-domain 6.

In the present embodiment, the cell dimension for a basic dimension of 2 μ is 10×8=80 $\mu m^2$, which is comparable to the cell area of 70 $\mu m^2$ of 256K DRAM of 2 μ design rule, and which is almost ⅓ of the cell area of 200 to 300 $\mu m^2$ in the conventional semiconductor image pickup devices. Also the percentage of aperture excluding the electrode 8 and the metal wiring 10 is 51% and is practically acceptable.

In the present embodiment, the use of LOCOS process in the formation of the field oxide layer 3 provides a flat surface, thus facilitating fine pattern formation in the following steps. Also the field oxide layer 3 is used in the self alignment in the formation of the p-region 4 and n+-region 6 to avoid alignment error, thereby obtaining stable characteristics of the aforementioned bipolar transistor. Also since the n+-region 6 is formed by the self-alignment process utilizing the electrode 8, the p-region 4 constituting the active area can be formed with a minimum necessary area, without unnecessary gate-emitter parasitic capacitance. Also the electrode 8 can be formed very close to the p-region 4 constituting the base region, or the active domain of the transistor, so that various parasitic effects resulting from excessive base resistance can be avoided. Also, since the active area, or p-domain 4, can be made minimum, it is possible to reduce the base-collector capacitance and to improve the device characteristics.

In another embodiment of the present invention, a conventional photoetching process may be employed, instead of the LOCOS process, for forming the field insulating layer 3. Though such process is disadvantageous in obtaining a flat surface, it is free from bird's beaks associated in the LOCOS process and can form the base and emitter with exact dimensions. Thus such an embodiment achieves further stabilization of the transistor performance.

Also as another embodiment, another substrate such as an epitaxial substrate is employed as the silicon substrate 2 for simultaneous formation of an NMOS device etc.

A further increase in the percentage of aperture can be achieved, in the foregoing embodiments, by forming the sensor cell larger than 5×4 times of the basic dimension. In this case, the p-region 4 should be preferably positioned close to the corner of the sensor cell for achieving a higher percentage of aperture.

The electrode 8 and the metal wiring 10 can be composed of any usual material, such as polysilicon aluminum, an aluminum alloy, a high-melting metal or a silicide. Also the insulating layer 7 may be composed of any usual material such as an oxide or a nitride.

As explained in the foregoing, the method of the foregoing embodiments for producing the photoelectric converting device improves the positional precision of the control electrode area and the main electrode area without margins that are unnecessary through formation thereof by a self-aligning process, thereby reducing the cell size of the sensor cell and providing the photoelectric converting device inexpensively with an improved production yield. The foregoing embodiments are advantageously applicable for example to semiconductor image pickup devices requiring a high level of integration.

For the purpose of improving the production yield of semiconductor image pickup devices of a CCD type, a photoelectric converting device is employed in which an stored charge is generated in the control electrode area of a transistor and the detection of a light signal is achieved by controlling the stored charge.

In the following such photoelectric converting device will be explained.

Figure 3A:
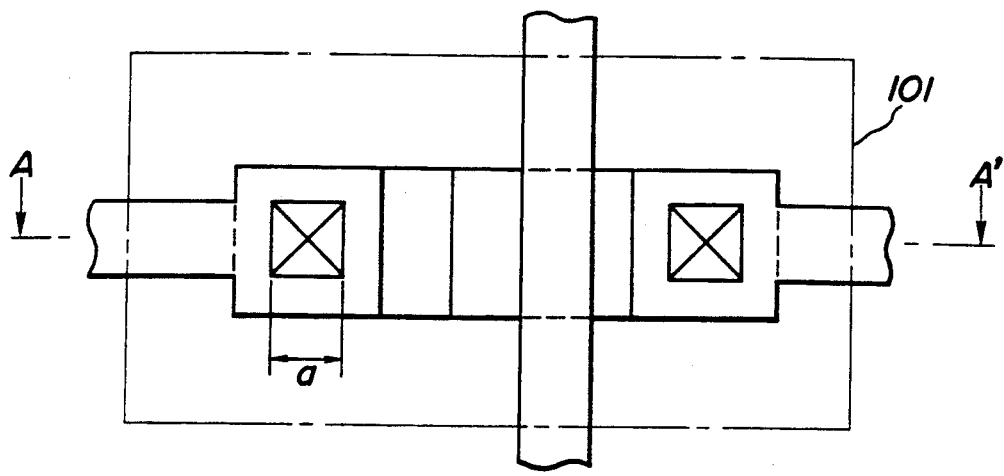
FIGS. 3(a) and 3(b) are schematic views of a sensor cell of a conventional photoelectric converting device.
Figure 3B:
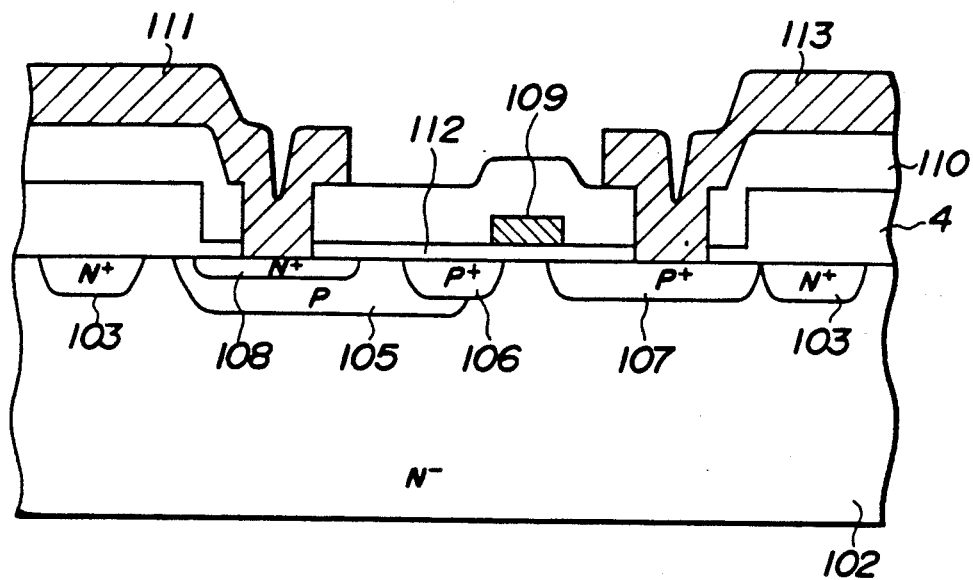

FIG. 3(a) is a plan view of a sensor cell of the photoelectric converting device, and FIG. 3(b) is a cross-sectional view along a line A-A' in FIG. 3(a).

In FIG. 3(a), a sensor cell 101 has a size equal to 10×5 times of the basic dimension (minimum design rule equal to the lateral length a of contact holes for metal wirings 111, 113), and is composed as follows. An N-type diffused separating layer 103, a P-type diffused base layer 105, a P-type diffused source layer 107, and a P-type diffused drain layer are formed on N-type silicon substrate 102, and an N-type diffused emitter layer 108 is formed on said p-type diffused base layer 105. The N-type diffused emitter layer 108, P-type diffused base layer 105 and N-type silicon substrate 102 constitute an NPN bipolar transistor, while the P-type diffused source layer 107, P-type diffused drain layer 106 and a gate electrode 109 formed across a gate oxide layer 112 constitute a PMOS transistor. Elements 111 and 113 are metal conductors.

In the following the function of the above-explained photoelectric converting device is explained.

In response to incident light, electron-positive hole pairs are generated in the semiconductor in proportion to the intensity of the incident light. The electrons escape from the positively biased N-type silicon substrate 102, but the positive holes are stored in the P-type diffused base layer 105

Storage Operation

The base potential is elevated by the stored holes, and is further elevated by a voltage applied across the N-type diffused emitter layer 108 and the N-type silicon substrate 102 constituting the emitter, and a positive voltage applied to the gate electrode 109. The change in base potential is read as a change in the collector current, thus as an electric signal corresponding to the intensity of the incident light (read-out operation). Also the charge stored in the P-type diffused base layer 105 can be dissipated through the metal conductor 113 by turning on the aforementioned PMOS transistor (refreshing operation). The above-explained steps of storage, read-out refreshing are repeated thereafter.

The above-explained structure is not suitable for a high level of integration because the area of the sensor cell is increased by the PMOS transistor employed for refreshing operation.

For achieving a high level of integration, there may be employed a refreshing method of forming an electrode on the gate oxide layer 112 on the P-type diffused base layer 105, instead of said PMOS transistor, and applying a voltage to the electrode to dissipate the stored charge. However, this method has a drawback that the linearity of photoelectric conversion is affected because the base potential is not clearly fixed.

In the following there will be explained another embodiment of the present invention, which resolves the above-explained drawbacks of the prior technology, while making reference to the attached drawings.

Figure 4A:
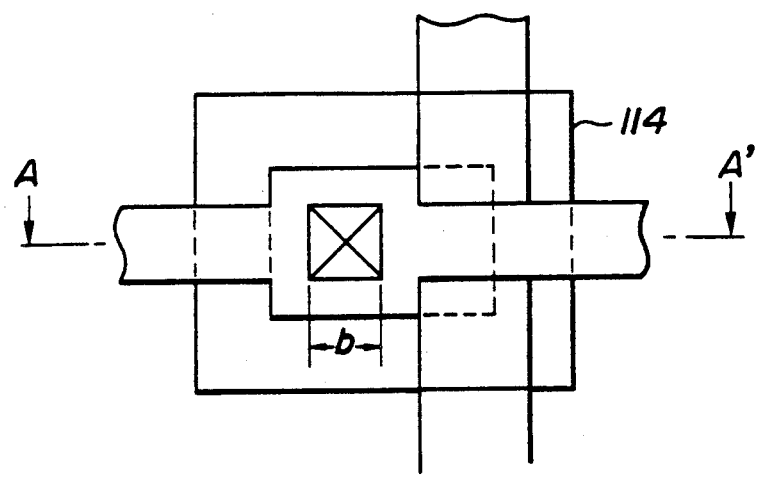
FIGS. 4(a) and 4(b) are schematic views of a sensor cell of a photoelectric converting device of the present invention.
Figure 4B:
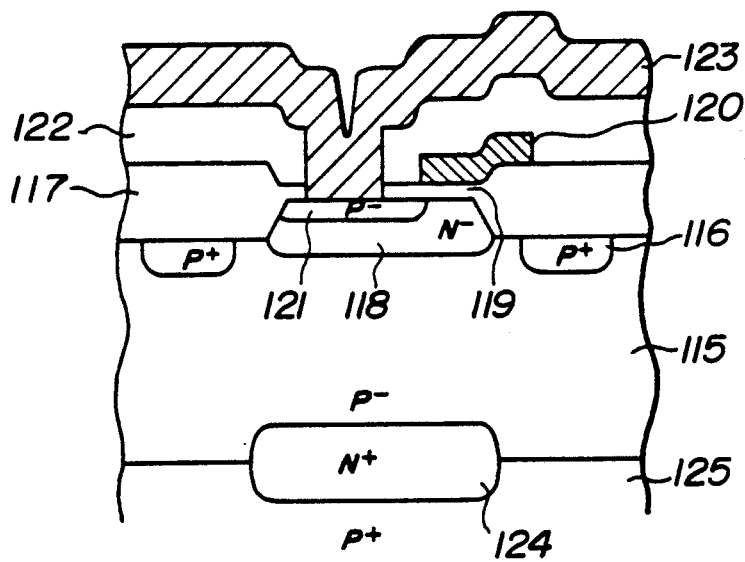

FIG. 4(a) is a plan view of a sensor cell of a photoelectric converting device in the embodiment of the present invention, and FIG. 4(b) is a cross-sectional view along a line A-A' in FIG. 4(a). In the present embodiment the transistor is composed of a bipolar transistor, and the control electrode is composed of base area.

In FIG. 4(a) a sensor cell 114 has a size of 5×4 times of the basic dimension (lateral length b of the contact hole of a metal wiring 123), and is isolated by the LOCOS process as will be explained later, but is reduced to 1/2.5 in area compared to the structure shown in FIGS. 3(a) and 3(b). The sensor cell 114 is formed in the following manner. At first, on a CZP(100) 1 $\Omega$-cm silicon substrate 125, there are formed an N-type embedded diffusion layer 124 of a resistivity of 20 $\Omega/cm^2$ and a P-epitaxial 115 of an impurity concentration of $10^{15}/cm^3$ and of a thickness of 3.5 $\mu$m. Then a P-type diffused separation layer 116 and a field oxide layer 117 of a thickness of 1 $\mu$m by the LOCOS process. Subsequently an N-type diffused base layer 118 of a depth of 0.8 $\mu$m, an insulation layer 119 of a thickness of 500 Å composed for example of an oxide layer, and a polysilicon electrode 120 of a thickness of 4,000 Å are formed. The electrode 120 functions as the gating electrode for the N-type diffused base layer 118. Subsequently a P-type diffused emitter layer 121 of a depth of 0.3 $\mu$m is formed by a self-alignment process, and there are then formed an interlayer insulation layer 122 and a metal conductor 123. The P-type diffused emitter layer 121, N-type diffused base layer 118 and P-type epitaxial layer 115 constitute a PNP bipolar transistor, and the electrode 120 serves to control the accumulated charge.

The aforementioned N-type embedded diffusion layer 124, P-type epitaxial layer 115 and N-type diffused base layer 118 constitute an NPN vertical transistor or an N-type JFET serving as a second transistor of the present invention. The photo-induced charge stored in the N-type diffused base layer 118 can be dissipated through the N-type embedded diffusion layer 124, by a punch through between the layer 124 and the N-type base layer 118 induced by a positive voltage applied to the N type embedded diffusion layer 124.

The photoelectric converting device of the present embodiment, does not require a MOS transistor for dissipating the charge stored in the N-type diffused base layer and, can reduce the cell size to $10 \times 8 = 80$ μm² for a basic dimension of 2 μm, which is comparable to the cell area of 70 μm² of a 256K DRAM with a same basic dimension.

The photoelectric converting device of the present embodiment is further provided with an overflow drain structure.

Figure 5A:
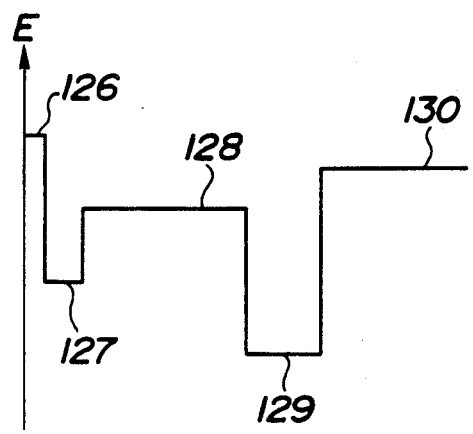
FIGS. 5(a) and 5(b) are charts showing the potential characteristics of said photoelectric converting device.
Figure 5B:
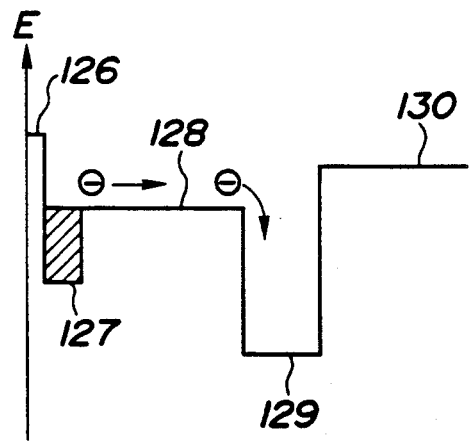

FIGS. 5(a) and 5(b) show potential status of this embodiment, respectively in a state without photo-induced charge and a state with excessive photo-induced charge.

In FIGS. 5(a) and 5(b) there are shown the energy levels 126, 127, 128 and 130 respectively of the P-type diffused emitter layer 121, N-type diffused base layer 118, P-type epitaxial layer 115, and N-type embedded diffusion layer 124.

The electrons of the photo-induced charge generated in the vicinity of the P-type epitaxial layer 115 are stored, through diffusion, in the N-type diffused base layer 118. When the electrons are stored, the energy level 127 of the N-type base layer 118 is elevated and becomes substantially equal to that of the P-epitaxial layer 115 as shown in FIG. 5(b), so that the electrons are no longer stored but move to the N-type embedded diffusion layer 124.

The photoelectric converting device of the present embodiment, in which the charge stored in to the N-type diffused base layer 118 is transferred to the N-type embedded diffusion layer 124 y a punch-through induced by a voltage applied to the layer 124 and, can provide a linear photoelectric conversion characteristic with a satisfactory blooming resistance.

In the present embodiment the LOCOS process employed for forming the field oxide layer 117 may be replaced by a conventional photoetching process. Also an N-type silicon substrate may be employed if desirable instead of P-type.

As another embodiment of the present invention, the conductive type of the above-explained photoelectric converting device may be totally inverted. In this case, after the formation of the base region, the boron dopant in the P-type base layer 118 is extracted by thermal treatment into the field oxide layer. A resulting lower concentration at the interface tends to cause channel leak phenomenon, and suitable countermeasure will be required therefor.

As explained detailedly above, the foregoing embodiments provide a photoelectric converting device which ensures linearity of photoelectric conversion by discharging the charge stored in a control electrode area into an embedded area, and which enables a high level of integration and an economical production due to the absence of MOS transistors for a refreshing operation.

Next, in a type of photoelectric converting device, the contact holes for the emitter electrode has to be formed by alignment, with an aligner, on the emitter region after the formation thereof. Consequently, in case of obtaining a high level of integration, for example of $1,000 \times 1,000$ pixels, the cell size has to be reduced while the contact hole is maintained at an approximately current size. Consequently the emitter and the base will occupy a larger proportion to the cell, thus practically reducing the potential Vp generated in the base.

Figure 6A:
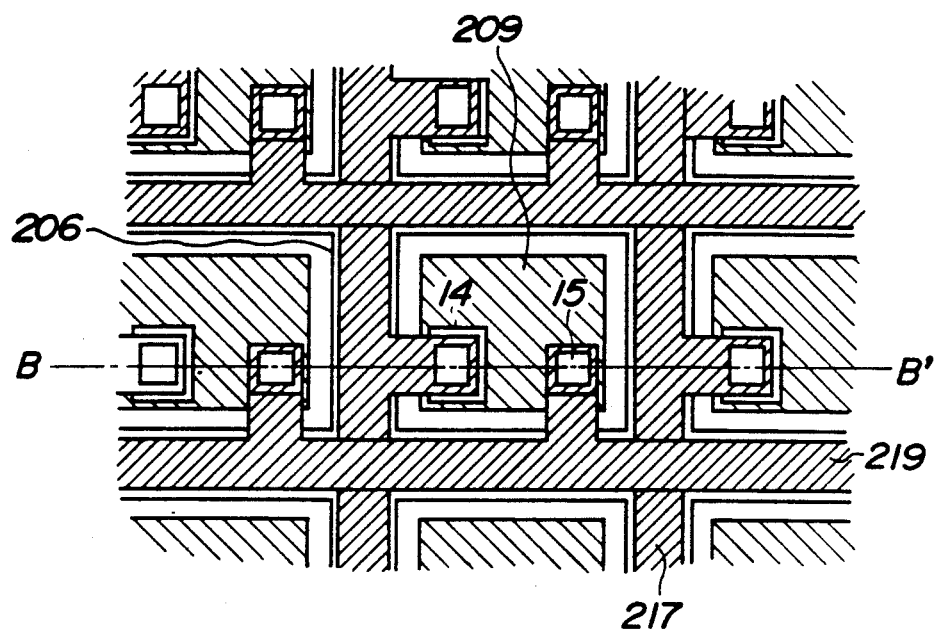
FIG. 6(a) is a plan view of a photoelectric converting device embodying the present invention.
Figure 6B:
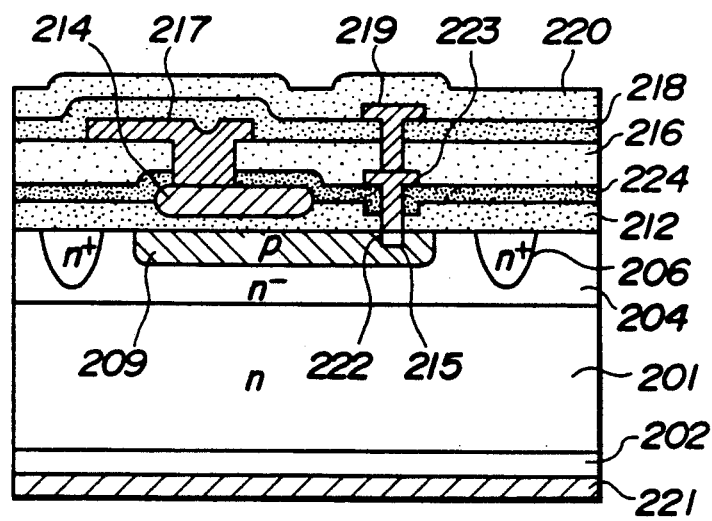
FIG. 6(b) is a cross-sectional view of a cell along a line B-B' in FIG. 6(a)

FIG. 6(a) is a plan view of an embodiment of the photoelectric converting device of the present invention capable of resolving the above-explained drawbacks, and FIG. 6(b) is a cross-sectional view of a cell thereof along a line B-B', equivalent portions as those in FIGS. 6(a) and 6(b) are represented by same numbers and will not be explained further.

Referring to FIGS. 6(a) and 6(b), a p-base domain 209 for accumulating photo-induced charge is formed in an n-epitaxial layer 204 and an n⁺-emitter region 215 by impurity diffusion from an n-doped polysilicon electrode 223 is formed in said p-base domain 209 through a self-aligning process.

Such self-aligned formation of the n⁺-emitter domain 215 from the electrode 223 reduces the emitter size.

FIGS. 7(a) to 7(i) illustrate steps of the method of producing the device of the present embodiment.

Figure 7A:
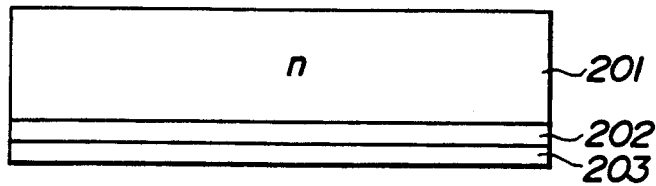
FIGS. 7(a) to 7(k) are views showing the steps of the method of producing the photoelectric converting device in said embodiment.

At first, as shown in FIG. 7(a), an n⁺-layer 202 of an impurity concentration of $1 \times 10^{17}$ to $1 \times 10^{20}$ cm⁻³ for ohmic contact is formed, by the diffusion of P, As or Sb, on the rear face of an n-silicon substrate 201 with an impurity concentration of $1 \times 10^{15}$ to $5 \times 10^{18}$ cm⁻³. Subsequently an oxide layer 203, for example an SiO₂ layer, of a thickness of 3,000 to 7,000 Å is formed by a CVD process on said n⁺-layer 202.

The oxide layer 203 is called back coat, and prevents the formation of impurity vapor when the substrate 201 is heat treated.

Figure 7B:
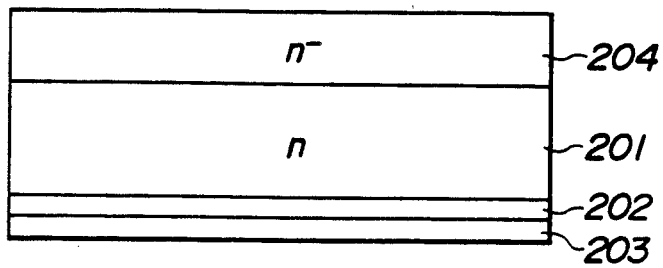

Then the surface of the substrate 201 is etched for ca. 1.5 minutes at 1,000° C. and with 2 l/min. of HCl and 60 l/min. of H₂, and an n⁻-epitaxial layer (hereinafter called n⁻-layer) 204 is formed at a temperature of 1,000° C. and a reduced pressure of 120-180 Torr, with 1.2 l/min. of SiH₂Cl₂ (100%) as source gas and 100 cc of PH₃ diluted to 20 ppm with H₂ as doping gas. The monocrystal growth rate is 0.5 μm/min., the layer thickness is 2 to 10 μm, and the impurity concentration is in a range from $1 \times 10^{12}$ to $10^{16}$ cm⁻³, preferably from $10^{12}$ to $10^{14}$ cm⁻³. This state is shown in FIG. 7(b).

For improving the quality of said n⁻-layer 204, it is extremely effective to remove oxygen from the vicinity of the surface of the substrate by a high-temperature treatment at 1150°-1250° C., and then to generate a number of microdefects in the substrate by a prolonged heat treatment at ca. 800° C., thereby obtaining a substrate with a denuded zone capable of intrinsic gettering.

Subsequently, on the n⁻-layer 204, a buffer oxide layer 208 of a thickness of 500 to 1,500 Å is formed by pyrogenic oxidation (H₂+O₂), wet oxidation (O₂+H₂O), steam oxidation (N₂+H₂O) or dry oxidation. Pressurized oxidation at 800° to 1,000° C. is suitable for obtaining a satisfactory oxide layer without lamination defects.

The oxide layer 208 is formed for preventing the channeling and surface defects at the formation of the base region by ion implantation. The oxide backcoat layer 203 is completely removed in this step.

Figure 7C:
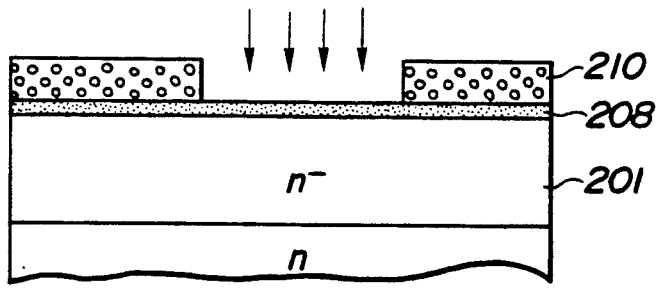

Then a resist material 210 is coated, and is selectively removed in an area corresponding to the base region, as shown in FIG. 7(c).

Subsequently B⁺ ions or BF₂⁺ ions generated from BF₃ are implanted into the wafer, with a surface concentration in a range from $1 \times 10^{15}$ to $5 \times 10^{18}$ cm⁻³, preferably from 1 to $20 \times 10^{16}$ cm⁻³, and with an amount of ion implantation of $7 \times 10^{11}$ to $1 \times 10^{15}$ cm⁻², preferably $1 \times 10^{12}$ to $1 \times 10^{14}$ cm⁻².

Figure 7D:
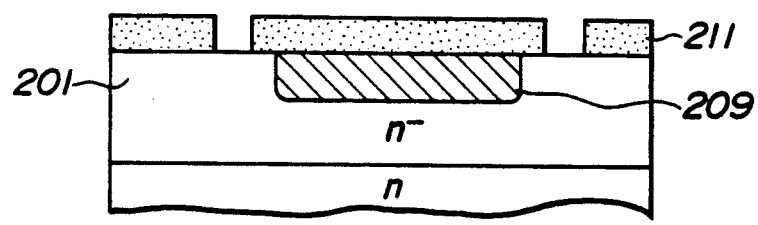

Thereafter the resist 210 is removed, and the p-base 209 region is formed to a predetermined depth by thermal diffusion at 1,000°-1,100° C. and in a N₂ atmosphere, simultaneous with the formation of a thick oxide layer 211 on the surface of the substrate 201. Subsequently the oxide layer 211 is selectively removed in a portion where the separating area 206 is to be formed, as shown in FIG. 7(d).

The depth of the p-base region 209 is for example 0.6 to 1.0 μm, but the depth and the impurity concentration are determined according to the following concept.

For achieving a higher sensitivity, it is desirable to reduce the impurity concentration of the p-base region 209, thereby reducing the base-emitter capacitance Cbe, which is approximately determined by the following equation:

$$C_{be} = A\epsilon\epsilon \left(\frac{q \cdot N_A}{2\epsilon V_{bi}}\right)^{\frac{1}{2}}$$

wherein $V_{bi}$ is the emitter-base diffusion potential given by:

$$V_{bi} = \frac{kT}{q} \ln \frac{N_A N_D}{n_i^2}$$

wherein $\epsilon$ is the dielectric constant of the silicon crystal, $N_D$ is the impurity concentration of the emitter, $N_A$ is that of the base adjacent to the emitter, $n_i$ is the intrinsic carrier concentration, Ae is the area of the base region, k is Boltzman constant, T is the absolute temperature, and q is the unit charge. A smaller $N_A$ will reduce the value of Cbe and increase the sensitivity, but is so selected as not to be excessively small, since an excessively small value of $N_A$ will render the base region completely deficient in its operating state and bring the same to a punch-through state.

The base region 209 can also be formed by depositing BSG on the wafer and diffusing the impurity B into a predetermined depth by thermal diffusion at 1,100°–1,200° C.

Subsequently an impurity n+ is diffused for forming the separating area 206 with a concentration of $10^{17}$–$10^{21}$ cm$^{-3}$ either by diffusion from POCl$_3$ or by ion implantation. A satisfactory result could be experimentally obtained by the process with POCl$_3$, with a furnace temperature of 850°–1,000° C., a flow rate of 50–200 cc/min. of the carrier gas for POCl$_3$ bubbling, and a process time of 10–40 minutes.

Figure 7E:
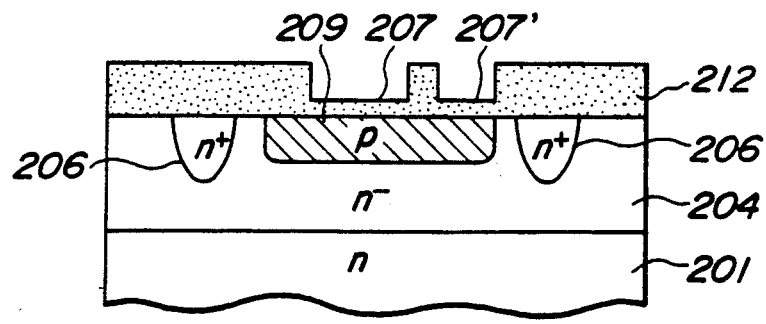

After the formation of the separating area 206 and the base region 209 in this manner, a thick oxide layer 212 is formed by oxidation on the substrate 201. Subsequently the oxide layer 212 is selectively removed in the areas where the capacitor electrode and the emitter are to be formed, and a gate oxide layer 207 and an oxide layer 207' of a thickness of 100–1,000 Å are formed respectively in thus obtained apertures, as shown in FIG. 7(e).

Figure 7F:
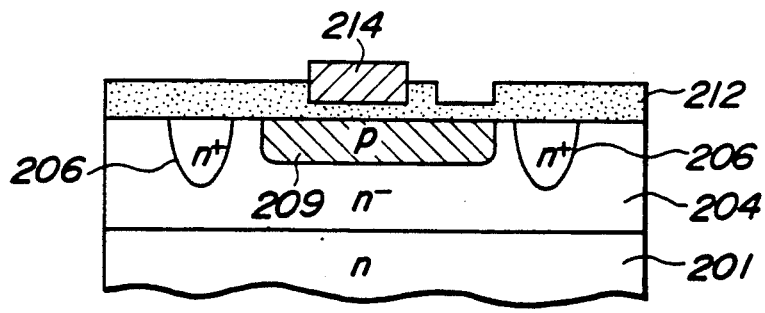

Then as As-doped polysilicon layer is deposited by CVD process from (N$_2$+SiH$_4$+AsH$_3$) gas or (H$_2$+SiH$_4$+AsH$_3$) gas, with a thickness of 2,000 to 7,000 Å, at a deposition temperature of 550°–900° C. Naturally it is possible to deposit non-doped polysilicon by CVD process and then to dope the polysilicon with As or P. The polysilicon layer thus deposited is then photolithographically etched off to obtain the polysilicon layer 214 constituting the capacitor electrode, as shown in FIG. 7(f).

Figure 7G:
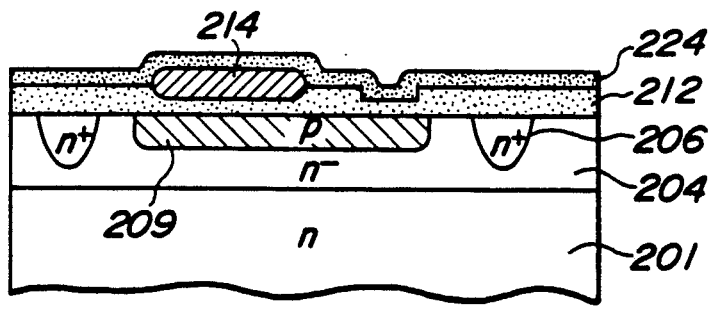

On the polysilicon layer 214 and the oxide layer 212, there is formed a thermal oxide layer 224 of a thickness of 100–1,000 Å serving as the interlayer insulating layer, as shown in FIG. 7(g).

Figure 7H:
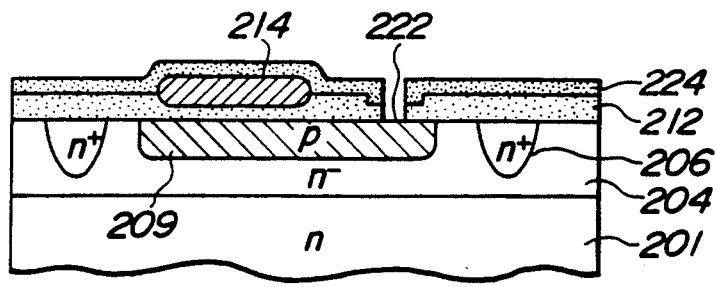

Then a contact hole 222 is formed in a position in the p-base region 209 where the emitter domain is to be formed, as shown in FIG. 7(h).

Figure 7I:
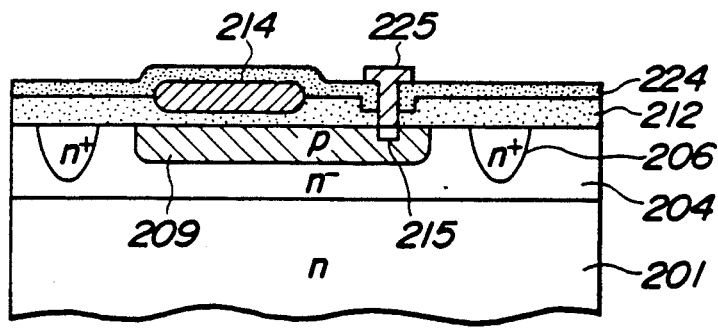

Subsequently as As-doped polysilicon layer is deposited by CVD process from (N$_2$+SiH$_4$+AsH$_3$) gas or (H$_2$+SiH$_4$+AsH$_3$) gas, with a thickness of 2,000 to 7,000 Å, at a deposition temperature of 550°–900° C. Naturally it is possible to deposit non-doped polysilicon by CVD process and then to dope said polysilicon with As. The polysilicon layer thus deposited is then photolithographically etched off to form a polysilicon electrode 225, and a thermal treatment is effected to diffuse As, contained in the polysilicon electrode 225, into the p-base domain 209, thereby forming an n+-emitter domain 215 by self-alignment, as shown in FIG. 7(i).

It is also possible to form the polysilicon layer 214 after the formation of the emitter area 215, but the thermal treatment at the formation of the insulating layer 224 after the thermal diffusion for emitter formation further increases the thermal diffusion of the emitter domain 215, thus deteriorating the control characteristics of the transistor. It is therefore desirable to form the polysilicon electrode 225 and the emitter domain 215, after the formation of the polysilicon layer 214.

Figure 7J:
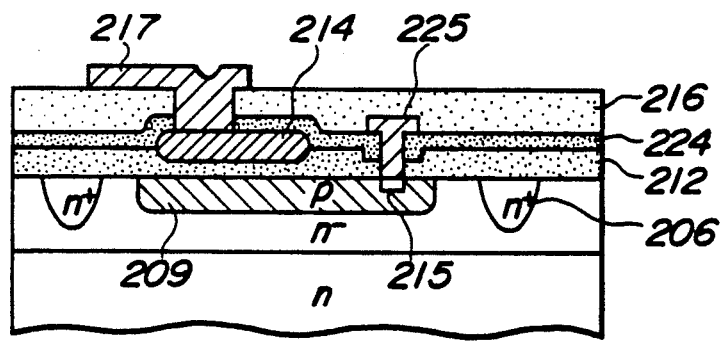

Subsequently a PSG layer or a SiO$_2$ layer 216 of a thickness of 3,000–7,000 Å is formed by a gas CVD process explained above, and a contact hole is opened on the polysilicon layer 214 through a masking step and an etching step. A metal electrode 217, for example of Al, Al—Si or Al—Cu—Si, is deposited by vacuum evaporation or sputtering in said contact hole, as shown in FIG. 7(j).

Figure 7K:
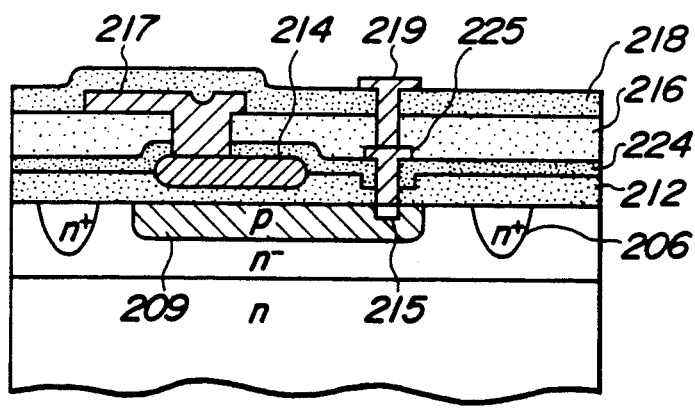

Then an insulating interlayer 218, for example a PSG layer or a SiO$_2$ layer, of a thickness of 3,000–9,000 Å is deposited by a CVD process. A contact hole is opened on the emitter region 215 through a masking step and an etching step, a metal electrode 219, for example of Al, Al Si or Al—Cu—Si is formed therein, as shown in FIG. 7(k).

Finally a passivation layer 220, composed for example of a PSG layer or a Si$_3$N$_4$ layer is formed by a CVD process, and a metal electrode 221, composed for example of Al, Al—Si or Au is formed on the rear face of the wafer to obtain the photoelectric converting device shown in FIGS. 6(a) and 6(b).

In the foregoing explanation the separating area is composed of an n+-semiconductor, but it may naturally replaced by a p+-semiconductor in case of a PNP bipolar transistor.

As detailedly explained above, the photoelectric converting device of the present embodiment is capable of reducing the area of a main electrode, for example the emitter, by the formation in a control electrode region through a self-alignment, thereby reducing the area of the control electrode. Thus a higher level of integration can be achieved without a loss in the photo-induced potential, since a reduction in the photo-induced charge Q caused by the cell size reduction can be wholly or almost wholly compensated by the reduction of the size of the control electrode area.

What is claimed is:

1. A method for producing a photoelectric conversion device comprising a phototransistor cell including a first and a second main electrode region of a first conductivity-type semiconductor material and a control electrode region of a second conductivity-type semiconductor material different from said first conductivity-type semiconductor material in which an electrode for controlling a potential of said control electrode region is formed on a portion of said control electrode region, comprising the steps of:

preparing a substrate provided with a first semiconductor region of said first conductivity-type semiconductor material so as to form said first main electrode region;

forming a field insulating layer region on said first semiconductor region so as to define the cell;

forming a second semiconductor region of the second conductivity-type semiconductor material within said first semiconductor region by a self-alignment process utilizing said field insulating layer region as a mask, so as to form said control electrode region;

forming an electrode on a portion of said second semiconductor region and a portion of said field insulating layer region;

forming a third semiconductor region of the first conductivity-type semiconductor material within said second semiconductor region by a self-alignment process utilizing said field insulating region and said electrode as a mask, so as to form said second main electrode region;

forming an insulating layer on said third semiconductor region;

forming a contact hole in said insulating layer; and forming an electrode connected to said third semiconductor region via said contact hole.

2. A method according to claim 1, wherein said transistor is a bipolar type.

3. A method according to claim 1, wherein a plurality of said cells are provided.

* * * * *

UNITED STATES PATENT AND TRADEMARK OFFICE
CERTIFICATE OF CORRECTION

PATENT NO. : 5,089,425
DATED : February 18, 1992
INVENTOR(S) : JUNICHI HOSHI ET AL.                Page 1 of 3

It is certified that error appears in the above-identified patent and that said Letters Patent is hereby corrected as shown below: Title page:

AT [56] REFERENCES CITED

U.S. Patent Documents, insert
--4,814,846   3/1989   Matsumoto et al.
  4,794,443  12/1988   Tanaka et al.--.

Foreign Patent Documents, "60-142561  7/1988 Japan" should read --60-142561  7/1985  Japan--.

Other Publications,
"Engineering" should read --Engineering,--.

COLUMN 1

Line 9, "abandoned" should be deleted.
Line 10, "1987." should read
         --1987, both now abandoned.--.
Line 28, "as" (first occurrence) should be deleted.
Line 46, "Thus" should read --Thus,--.

COLUMN 2

Line 21, "domain" should read --region--.

COLUMN 3

Line 15, "p-domain" should read --p-region--.
Line 21, "Said" should read --The-- and
         "p-domain" should read --p-region--.
Line 27, "an" should read --and an--.
Line 50, "$n^+$-domain" should read --$n^+$-region--.
Line 67, "is" should read --being--.

UNITED STATES PATENT AND TRADEMARK OFFICE
CERTIFICATE OF CORRECTION

PATENT NO. : 5,089,425

DATED : February 18, 1992

INVENTOR(S) : JUNICHI HOSHI ET AL.

Page 2 of 3

It is certified that error appears in the above-identified patent and that said Letters Patent is hereby corrected as shown below:

COLUMN 4

Line 52, "domain" should read --region--.
    Line 55, "p-domain" should read --p-region--.

COLUMN 5

Line 29, "an" should read --a--.
    Line 38, "of" should be deleted.
    Line 45, "p-type" should read --P-type--.
    Line 60, "layer 105" should read --layer 105.--.

COLUMN 6

Line 7, "read-out" should read --read-out and--.
    Line 40, "P-epitaxial 115" should read
            --P-type epitaxial layer 115--.
    Line 43, "by" should read --are formed by--.
    Line 66, "N type" should read --N-type--.
    Line 68, "embodiment," should read --embodiment--.

COLUMN 7

Line 2, "and, can" should read --; and can--.
    Line 28, "to" should be deleted.
    Line 30, "y" should read --by--.
    line 31, "and," should read --, and--.".
    Line 56, "has" should read --have--.

UNITED STATES PATENT AND TRADEMARK OFFICE
CERTIFICATE OF CORRECTION

PATENT NO. : 5,089,425
DATED : February 18, 1992
INVENTOR(S) : JUNICHI HOSHI ET AL.

It is certified that error appears in the above-identified patent and that said Letters Patent is hereby corrected as shown below:

COLUMN 8

Line 2, "equivalent" should read --wherein equivalent--.
Line 9, "domain" should read --region--.
Line 11, "domain" should read --region--.

COLUMN 9

Line 56, "as" should read --an--.

COLUMN 10

Line 4, "domain" should read --region--.
Line 6, "as" should read --an--.
Line 16, "domain" should read --region-- and "do-" should read --region--.
Line 17, "main" should be deleted.
Line 23, "domain" should read --region--.
Line 25, "domain" should read --region--.
Line 39, "a" should read --and a--.
Line 40, "Al Si" should read --Al-Si--.

Signed and Sealed this

Seventh Day of September, 1993

Attest:

BRUCE LEHMAN

*Attesting Officer*    *Commissioner of Patents and Trademarks*